(12) United States Patent
Hunter et al.

(10) Patent No.: US 7,675,806 B2
(45) Date of Patent: Mar. 9, 2010

(54) LOW VOLTAGE MEMORY DEVICE AND METHOD THEREOF

(75) Inventors: Bradford Hunter, Austin, TX (US); David Burnett, Austin, TX (US); Troy Cooper, Austin, TX (US); Prashant Kenkare, Austin, TX (US); Ravindraj Ramaraju, Austin, TX (US); Andrew Russell, Austin, TX (US); Shayan Zhang, Austin, TX (US); Michael Snyder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 436 days.

(21) Appl. No.: 11/435,942

(22) Filed: May 17, 2006

(65) Prior Publication Data

US 2007/0280026 A1 Dec. 6, 2007

(51) Int. Cl.
*G11C 5/14* (2006.01)
(52) U.S. Cl. ............... 365/227; 365/226; 365/228; 365/229; 365/154
(58) Field of Classification Search ............ 365/226, 365/227, 228, 229, 154, 230.03
See application file for complete search history.

(56) References Cited

U.S. PATENT DOCUMENTS

| | | | |
|---|---|---|---|
| 5,471,421 A * | 11/1995 | Rose et al. ............ | 365/182 |
| 5,502,683 A | 3/1996 | Marchioro | |
| 5,612,642 A * | 3/1997 | McClintock ............ | 327/143 |
| 5,687,382 A * | 11/1997 | Kojima et al. ........... | 713/320 |
| 5,706,226 A * | 1/1998 | Chan et al. ............ | 365/156 |
| 5,710,742 A | 1/1998 | Carter et al. | |
| 5,748,643 A | 5/1998 | Pelella et al. | |
| 5,757,689 A | 5/1998 | Seno | |
| 5,761,146 A | 6/1998 | Yoo et al. | |

(Continued)

FOREIGN PATENT DOCUMENTS

JP 10027476 1/1998

(Continued)

OTHER PUBLICATIONS

U.S. Appl. No. 11/337,775, filed Jan. 23, 2006, entitled Electronic Device and Method for Operating a Memory Circuit.

(Continued)

*Primary Examiner*—Hoai V Ho
*Assistant Examiner*—Jay Radke (57) ABSTRACT

A device is disclosed having a low-voltage memory device. The device includes a first memory having a first memory topology and a second memory having a second memory topology, with both memories located in an integrated circuit. The first memory is a relatively high-density memory device, capable of storing large amounts of data relative to the second memory. The second memory is a low-voltage memory device capable of being accessed at low-voltages relative to the voltage at which the first memory can be accessed. Accordingly, the second memory is accessible when the integrated circuit is placed in a low-voltage mode of operation, which may represent a data retention state (sleep state) for the first memory or other portions of the integrated circuit. Thus, the device is able to store large amounts of data in the high density memory in a normal or active mode of operation, and also have access to the low-voltage memory during the low-voltage mode of operation.

18 Claims, 3 Drawing Sheets

U.S. PATENT DOCUMENTS

| | | | |
|---|---|---|---|
| 5,826,056 A | 10/1998 | Noda | |
| 5,828,597 A | 10/1998 | Madan | |
| 5,831,897 A | 11/1998 | Hodges | |
| 5,883,848 A | 3/1999 | Kim et al. | |
| 6,091,626 A | 7/2000 | Madan | |
| 6,307,805 B1 * | 10/2001 | Andersen et al. | 365/230.06 |
| 6,449,204 B1 * | 9/2002 | Arimoto et al. | 365/222 |
| 6,452,855 B1 * | 9/2002 | Hsu et al. | 365/189.16 |
| 6,466,504 B1 | 10/2002 | Roy | |
| 6,584,013 B2 * | 6/2003 | Senda et al. | 365/185.08 |
| 6,804,143 B1 | 10/2004 | Hobson | |
| 6,885,608 B2 | 4/2005 | Nagano | |
| 7,193,924 B2 | 3/2007 | Ramaraju et al. | |
| 2003/0038328 A1 * | 2/2003 | Ishio | 257/419 |
| 2004/0143769 A1 | 7/2004 | Deng et al. | |
| 2005/0028015 A1 | 2/2005 | Asano et al. | |
| 2005/0201178 A1 | 9/2005 | Ho et al. | |
| 2005/0219903 A1 | 10/2005 | Daga et al. | |
| 2006/0239057 A1 | 10/2006 | Muller et al. | |
| 2006/0274569 A1 | 12/2006 | Joshi et al. | |
| 2007/0025136 A1 * | 2/2007 | Yang | 365/145 |
| 2008/0259699 A1 * | 10/2008 | Van Berkel | 365/189.16 |

FOREIGN PATENT DOCUMENTS

| | | |
|---|---|---|
| JP | 2001143473 | 5/2001 |

OTHER PUBLICATIONS

Qin, Huifang et al., "SRAM Leakage Suppression by Minimizing Standby Supply Voltage", IEEE, 5th International Symposium on Quality Electronic Design, pp. 55-60, Aug. 24, 2004.

* cited by examiner

LOW VOLTAGE MEMORY DEVICE AND METHOD THEREOF

CROSS-REFERENCE TO RELATED APPLICATION

The present disclosure is related to co-pending application No. 11/337,775 entitled "ELECTRONIC DEVICE AND METHOD FOR OPERATING A MEMORY CIRCUIT."

FIELD OF THE DISCLOSURE

The present disclosure relates to memory devices.

BACKGROUND

Memory devices, such as random access memories (RAM), are used in a wide variety of devices to store data. A voltage is supplied to the memory device so that the memory can store data and respond to memory operations, such as read and write operations from a bus master that can include a processor, a direct memory access module, or other device. For many integrated circuits that use these memory devices, it is desirable that they operate in a low-voltage (e.g. sleep) mode, with a reduced voltage supplied to the memory and other device components. For example, portable devices such as cellular phones often employ a low-voltage mode to conserve battery power. However, in the low-voltage mode, the voltage supplied to a memory device can be reduced to a level that renders the memory device inaccessible to the bus master.

Accordingly, there is a need for an improved memory device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A device is disclosed having a low-voltage memory device. The device includes a first memory having a first memory topology and a second memory having a second memory topology, with both memories located in an integrated circuit. The first memory is a relatively high-density memory device, capable of storing large amounts of data relative to the second memory. The second memory is a low-voltage memory device capable of being accessed at low-voltages relative to the voltage at which the first memory can be accessed. Accordingly, the second memory is accessible when the integrated circuit is placed in a low-voltage mode of operation, which may represent a data retention state (sleep state) for the first memory or other portions of the integrated circuit. Thus, the device is able to store large amounts of data in the high density memory in a normal or active mode of operation, and also have access to the low-voltage memory during the low-voltage mode of operation.

Figure 1:
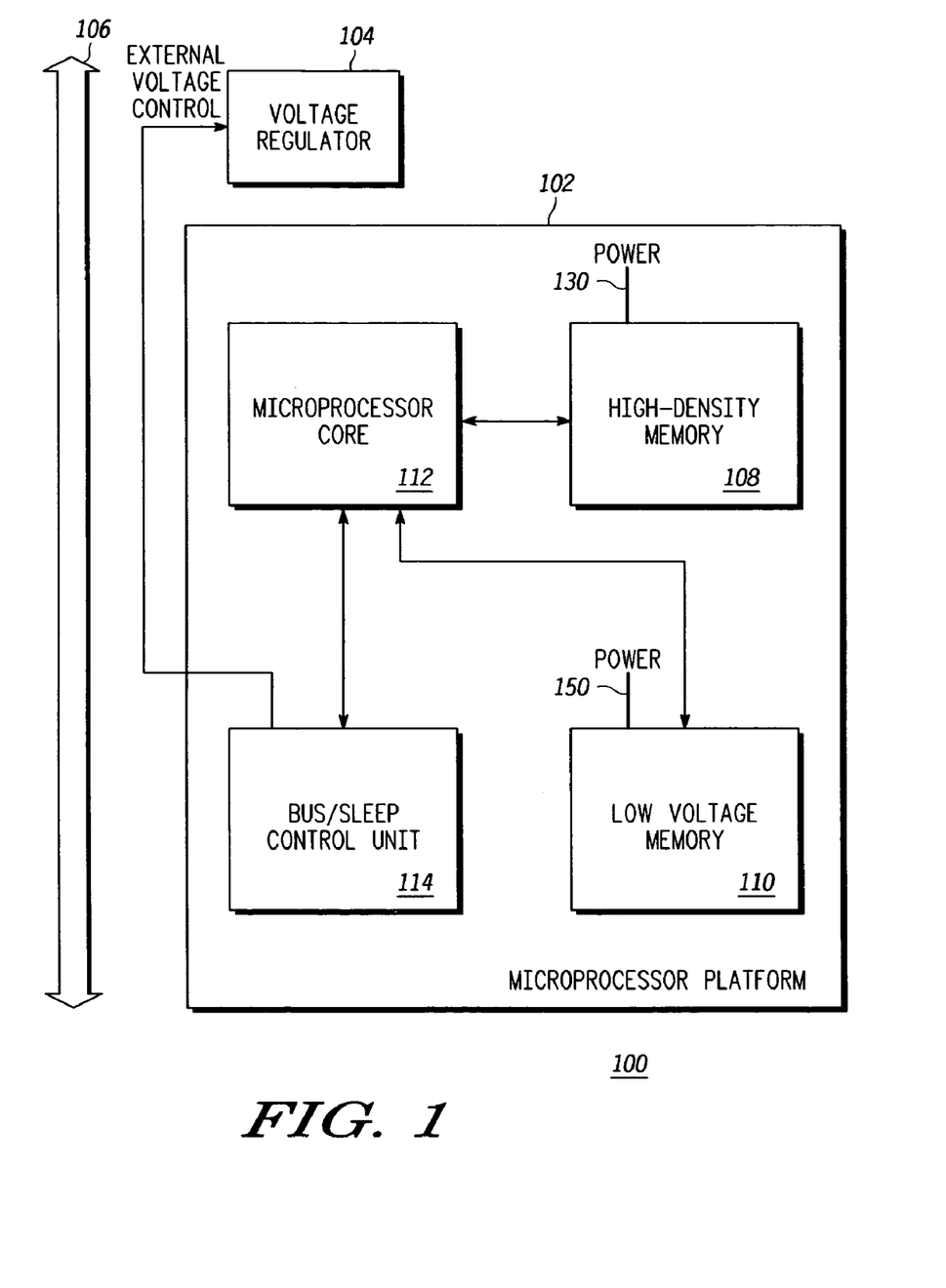
FIG. 1 is a block diagram of a particular embodiment of a system incorporating a memory device.

Referring to FIG. 1, a block diagram of particular embodiment of a device 100 is illustrated. The device 100 includes an integrated circuit 102, an external data bus 106, and a voltage regulator 104. The external data bus 106 is connected to the integrated circuit 102. The voltage regulator 104 can be connected to a power source (not shown) such as a battery, power supply, or other appropriate power source. The integrated circuit 102 can be located on an integrated circuit separate from the voltage regulator 104 and the external data bus 106. Alternatively, the voltage regulator 104 and the external data bus 106 may be located on the integrated circuit 102.

During operation, the integrated circuit 102 can communicate with external devices via the external data bus 106. In a particular embodiment, the integrated circuit 102 may be incorporated in a multi-core device, so that the integrated circuit 102 is accessible to external microprocessor cores (not shown) via the external data bus 106.

The voltage regulator 104 regulates the voltage supplied to the integrated circuit 102, which can operate in both active and low-voltage modes of operation. The functionality and operating voltage of the integrated circuit 102 depends on the mode of operation. For example, in the low voltage mode of operation, portions of the integrated circuit 102 are supplied a voltage that is lower than the voltage supplied in the active mode of operation, thereby potentially reducing the functionality of that portion of the integrated circuit 102. Accordingly, in the low-voltage mode of operation, the integrated circuit 102 can consume less power than in the active mode of operation, but may have reduced functionality.

In a particular embodiment, the mode of operation of the integrated circuit 102 can be controlled via an external pin (not shown) of the integrated circuit 102. The mode of operation of the integrated circuit 102 can depend on the state of a control signal applied at the external pin. Alternatively, the control signal applied at the external pin can toggle the mode of operation of the integrated circuit 102.

In another particular embodiment, the mode of operation of the integrated circuit 102 can be controlled by an internal register (not shown). The internal register can store a status flag or other data that determines the mode of operation for the integrated circuit 102. The mode of operation for the integrated circuit 102 can be changed by writing the appropriate data value to the internal register. The data could be written by one or more modules of the integrated circuit 102, or by an external module via the external data bus 106.

In the active mode of operation, the voltage regulator 104 supplies a voltage sufficient such that all of illustrated components of the microprocessor platform are in fully operable state. In the low-voltage mode, portions of the integrated circuit 102 are placed in an inoperable or inaccessible state, thereby reducing the power consumed by the integrated circuit 102.

To enter the low-voltage mode of operation, the integrated circuit 102 or other device instructs the voltage regulator 104 to reduce the voltage supplied to the integrated circuit 102 below the minimum operating voltage for portions of the platform.

Some portions of the integrated circuit 102 can remain operable or accessible in low-voltage mode of operation, so that the integrated circuit 102 can perform certain functions during the low-voltage mode of operation. For example, a request for data or other function can be received at the integrated circuit 102 via the external data bus 106 when the integrated circuit 102 is in low-voltage mode of operation.

Because some portions of the integrated circuit 102 are operable in the low-voltage state, the integrated circuit 102 can access the requested data without exiting the low-voltage mode of operation, thereby reducing power consumption of the platform. If requested data cannot be accessed in the low-voltage mode of operation, the integrated circuit 102 can enter the active mode to access data in the higher voltage memory.

The integrated circuit 102 includes a microprocessor core 112, a first memory 108, a second memory 110, and a bus interface unit and sleep control unit 114. The microprocessor core 112 includes bi-directional connections to the first memory 108, the second memory 110, and the bus interface unit and sleep control unit 114. In addition, the bus interface unit and sleep control unit 114 includes a connection to provide the control signal "External Voltage Control" to the voltage regulator 104. In a particular embodiment (not shown) the bus interface unit and sleep control unit 114 may also include a connection to the first memory 108 and the second memory 110. The first memory 108 includes a terminal 130 and the second memory includes a terminal 150. In a particular embodiment, the terminal 130 and the terminal 150 are connected to a common power supply terminal (not shown). In another particular embodiment, the terminal 130 and the terminal 150 are connected to different power supply terminals (not shown).

The microprocessor core 112 can be a processor core, (e.g. a central processing unit (CPU)), or other appropriate device. Alternately, the integrated circuit 102 can include a different bus master device, such as, for example, a direct memory access (DMA).

The first memory 108 has a relatively high-density memory topology as compared to the second memory 110. The memory topology of the first memory 108 is based on the arrangement of the transistors employed by the memory as well as the size of these transistors. In one embodiment, the first memory 108 is a six-transistor static random access memory (SRAM) memory and includes a large array of memory cells (not shown) relative to the second memory 110, and is optimized to consume a relatively small area of the integrated circuit 102. Because the first memory 108 is a relatively high-density memory, the microprocessor core 112 may use this memory to store large blocks of data.

The first memory 108 is characterized by a minimum operating voltage, which is the lowest voltage at which the first memory 108 can reliably respond to read and write operations. If the voltage supplied to the first memory 108 is below the minimum operating voltage, the first memory 108 is effectively inaccessible to the microprocessor core 112 and other devices. The first memory 108 is also characterized by a retention voltage that is lower than the minimum operating voltage associated with the first memory 108. Accordingly, the first memory 108 can retain stored data when the voltage supplied to the first memory 108 is below the minimum operating voltage but at or above a minimum retention voltage.

The second memory 110 is a low-voltage memory that operates at a lower voltage than the first memory 108. The second memory 110, like the first memory 108, is characterized by a minimum operating voltage and a retention voltage. In a particular embodiment, the minimum operating voltage for the second memory 110 is lower than the minimum operating voltage for the first memory 108, but higher than the retention voltage for the first memory 108. In one embodiment, the second memory 110 is an SRAM memory having additional transistors to facilitate its low voltage operation.

During operation, the first memory 108 and the second memory 110 may operate in different voltage domains, so that a different voltage is supplied to each of the first memory 108 and the second memory 110. This allows the first memory 108 to receive a higher voltage and the second memory 110 to receive a lower voltage. For example, to receive the different supply voltages, the first memory 108 and the second memory 108 may both be connected to different power supply terminals (not shown). Because the second memory 110 requires relatively low voltage for read and write operations, frequent accesses to the second memory 110 typically consume less power than accesses to the first memory 108. Accordingly, the second memory 110 may be used by the microprocessor core 112 to perform operations that require frequent read or write operations to memory, thereby reducing the power consumption of the integrated circuit 102. This is desirable in certain applications, such as when the integrated circuit 102 is located in a portable or battery operated device.

The first memory 108 and the second memory 110 may also operate in a single voltage domain, so that a common voltage is supplied to both memories. For example, the first memory 108 and the second memory 110 may both be connected to a common power supply terminal to receive the same supply voltage. This can simplify the design and control of the integrated circuit 102.

Further, the voltage supplied to the first memory 108 and the second memory 110 depends on the operating mode of operation of the integrated circuit 102. In the active mode of operation, the voltage supplied to the first memory 108 and the second memory 110 is sufficient so read and write operations can be performed on both memories.

In the low-voltage mode of operation, the voltage supplied to the first memory 108 is reduced below its minimum operating voltage, while the voltage supplied to the second memory 110 is maintained above the minimum operating voltage for the second memory 110. Accordingly, in the low-voltage mode of operation the first memory 108 is in a data retention mode whereby the data stored by the memory is inaccessible, but the second memory 110 remains accessible to data access requests. Thus, devices connected to the external data bus 106 can continue access the second memory 110 while in the low-voltage mode of operation. Being able to access the second memory can reduce the number of times the integrated circuit 102 exits the low-voltage mode of operation, thereby conserving power.

Note that in one embodiment the microprocessor core 112 can remain operational when the first memory 108 is in the low-voltage mode of operation. Accordingly, the second memory 110 can remain accessible in the low-voltage mode of operation to both the microprocessor core 112 and to devices connected to the external data bus 106.

In another embodiment, the voltage supplied to the microprocessor core 112 in the low-voltage mode of operation can differ from the voltage supplied to the first memory 108, so that the microprocessor core remains in the active mode of operation while the first memory 108 enters the low-voltage mode of operation. Accordingly, the microprocessor core can continue to access the second memory 110 while the first memory 108 is in the low-voltage mode of operation.

In a particular embodiment, the second memory 110 stores status data associated with the first memory 108, such as status flags or other information to indicate whether data stored in a particular memory location of the first memory 108 has been changed. The status information in the second memory 110 can be accessed during the low-voltage mode of operation to determine a status of information stored in the first memory and perform tasks based on the status information while the first memory remains in a retention mode. For example, if the status information indicates that data stored at a memory location of the first memory 108 has changed, the requesting device can instruct the bus interface unit and sleep control unit 114 to cause the microprocessor core 102 to exit the low-voltage mode of operation. The requesting device can then access the first memory and take appropriate action with respect to the changed memory location.

In an alternative embodiment, the second memory 110 mirrors a subset of the information stored in the first memory 108. For example, the second memory 110 can store a subset of system information that allows the requesting device to read and write data in the second memory that will replace the data it mirrors in the first memory upon exiting the low-voltage mode of operation.

Figure 2:
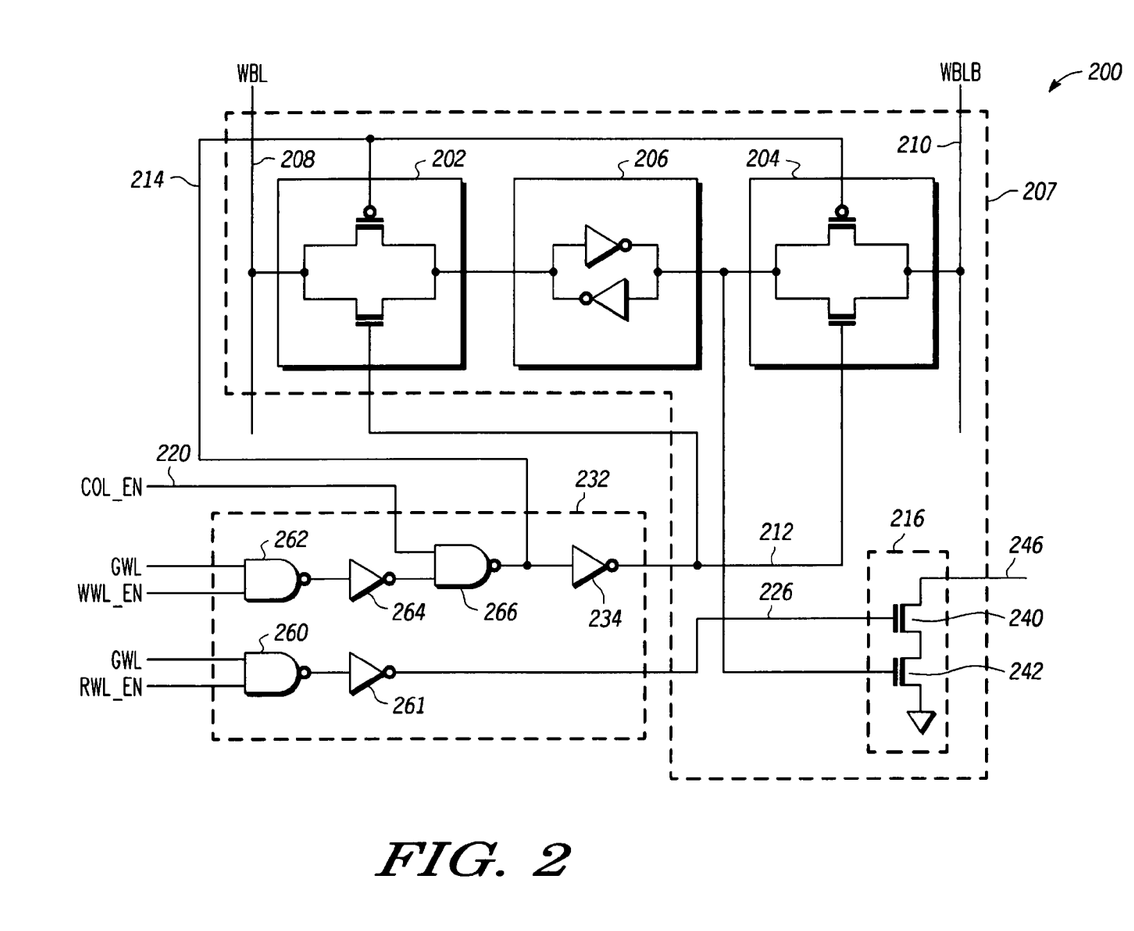
FIG. 2 is a block diagram of a particular embodiment of a memory topology of a bit cell used in conjunction with the memory device of claim 1.

Referring to FIG. 2, a particular embodiment of a memory device 200 corresponding to a low-voltage memory, such as the second memory 110, is illustrated in block diagram format. The memory device 200 employs a topology that generally includes a memory cell 207 and supporting control logic 232. In accordance with the illustrated embodiment, a bit cell 206 is connected to a first write bit line (WBL) 208 via a full pass gate (FPG) 202 and connected to a second complementary write bit line (WBLB) 210 via full pass gate (FPG) 204. The particular embodiment illustrated utilizes discrete conductors for providing read and write control signals as well as for the illustrated read bit line and write bit lines. Hence, a write control line (WCL) 212 and a complementary write control line (WCLB) 214 can be asserted during a write phase and negated during a read phase. The WCLB 214 and the WCL 212 can control the FPG 202 and the FPG 204.

Additionally, a read port 216 can be included as part of the topology of memory cell 207. The read port 216 can detect a signal stored by the bit cell 206 and provide a corresponding signal on the read bit line 246 during a read phase. The read port 216 can be configured with pull down transistors 240 and 242. A single storage node of the bit cell 206 can be connected to and drive one of the pull down transistors 240 and 242. Thus, when a read signal on read control line 226 is at a logic high and the bit cell 206 is storing a logic high, both transistors 240 and 242 will be turned on, pulling read line 246 to a low voltage to provide a signal indicative of the stored value. An inverter (not shown) can invert the signal on the read line 246 to provide a signal that is a replica of the signal stored at the bit cell 206 during the read phase. Note that a logic low stored at bit cell 206 would result in the output of port 216 being tri-stated during read phase. A current sensor (not shown) or pull-up transistor (not shown) connected to the read bit line (RBL) 246 (not shown) can be used to facilitate reading of the logic level stored at the bit cell.

Pull down transistors 240 and 242 can be metal oxide semi-conducting field effect transistors (MOSFET). These MOSFETs can have a resistive input gate impedance of several megaohms such that only a few microamperes of current ever flow to and from the storage node of the bit cell 206 during a read phase.

During a write phase, the NAND gate 266 can accept a column enable signal (col_en) via column enable line 220, a write enable signal (wwl_en) via write enable NAND gate 262 and inverter 264. During the write phase the write control line 212 transitions to a logic high value via inverter 234, and the complementary write control line 214 will transition to a logic low value. The FPG 202 and the FPG 204 can utilize both of these signals to turn on during a write phase. During a read phase, the NAND gate 260 can accept a read enable signal (rwl_en) to transition the read control line 226. Note that the gates 262 and 260 also receive a global word line (gwl) enable. The signal gwl can select a bank of wordline drivers to be further enabled by wwl_en.

Figure 3:
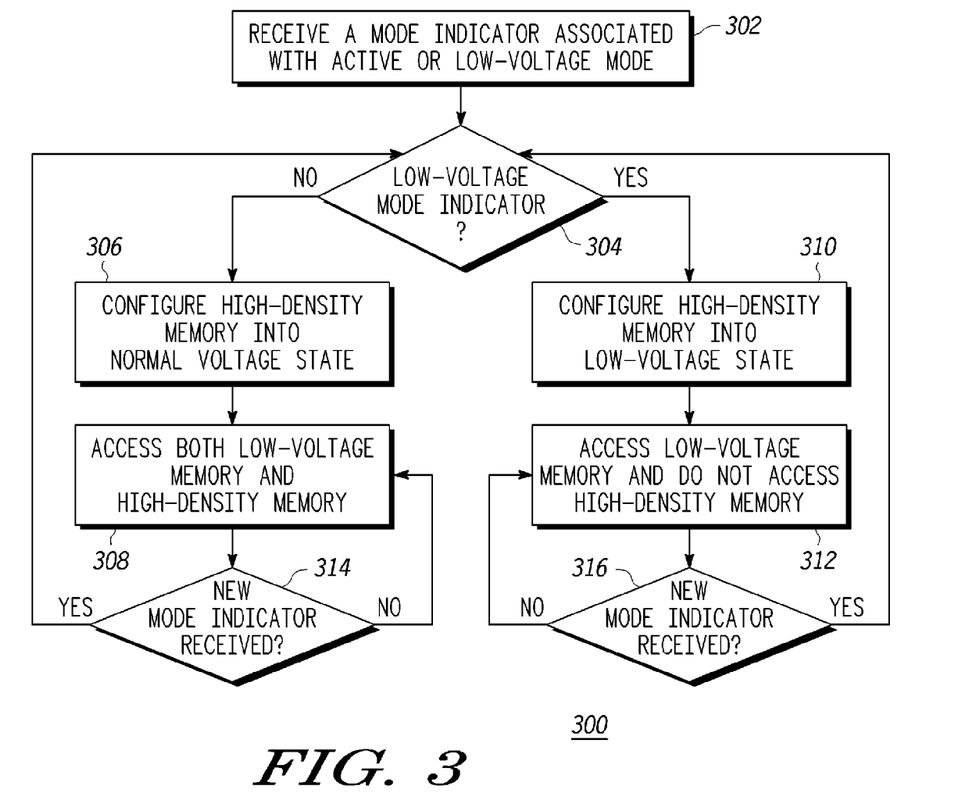
FIG. 3 is a flow chart of a particular embodiment of a method of configuring a memory device.

Referring to FIG. 3, a flow chart of a particular embodiment of a method 300 of configuring a memory device is illustrated. At block 302, a mode indicator is received that indicates one of a high-voltage mode of operation (active mode of operation) and a low-voltage mode of operation. The mode indicator may be received via an external interface of an integrated circuit device, via a microprocessor core, mode control module or other module located in the integrated circuit device. The mode indicator is associated with a mode of operation, such as a low-voltage mode of operation or an active mode of operation of an integrated circuit. The mode indicator may be based on a reset signal, a power on reset (POR) signal, a wake-up or sleep signal, or other appropriate mode indicator.

At block 304, it is determined whether the mode indicator received is an active mode of operation indicator or a low-voltage mode of operation indicator. This determination may be made by a microprocessor, a mode control module, or other appropriate module. The mode indicator can change the mode of operation of the integrated circuit. For example, if the mode indicator indicates a low-voltage mode of operation, the integrated circuit may be placed in a low-voltage mode of operation by applying a reduced voltage to one or more modules of the integrated circuit. In the low-voltage mode of operation, the integrated circuit can be configured so that the integrated circuit consumes less power relative to the level of power consumption in the active mode of operation. For example, voltage supplied to one or more modules of the integrated circuit can be reduced to reduce power consumption.

If the mode indicator is an active mode of operation indicator, the flow of the method 300 proceeds to 306, and a high-density memory located in the integrated circuit is configured in normal voltage state, so that a voltage above the minimum operating voltage of the memory is applied to the high-density memory. Moving to block 308, while the integrated circuit is in the active mode of operation, both the high-density memory and a low-voltage memory are accessible during operations in the integrated circuit by the microprocessor core or other modules. The flow of the method moves to block 314, and it is determined whether a new mode indicator has been received. If no new mode indicator has been received, the method returns to block 308. If a new mode indicator has been received, the flow of the method returns to decision block 304.

If, at decision block 304 the mode indicator is a low-voltage mode of operation indicator, the flow of the method 300 moves to block 310. At block 310, the high-density memory is configured into a low-voltage state. In this state, the voltage supplied to the high-density memory is reduced below the minimum operating voltage, so that read and write access to the high-density memory are effectively disabled. However, the voltage supplied to the high-density memory in the low-voltage mode of operation can be set above a retention voltage for the high-density memory, so that the memory retains stored data. Accordingly, in the low-voltage mode of operation, the high-density memory is effectively inaccessible, but can retain data that was stored in the memory during the active mode of operation.

Moving to block 312, the low-voltage memory is accessible by the microprocessor core or other module of the integrated circuit while access to the high-density memory is restricted. In a particular embodiment, the high-density memory is effectively inaccessible. In a particular embodiment, the low-voltage memory stores status data associated with the high-density memory. Accordingly, the microprocessor core can access status data associated with the high density memory without entering the active mode of operation. Accordingly, the integrated circuit is able to conduct some memory operations in the low-voltage mode of operation, thereby reducing the amount of time the integrated circuit must spend in the active mode of operation. This can reduce the overall power consumption of the integrated circuit.

The flow of the method moves to block 316, and it is determined whether a new mode indicator has been received. If no new mode indicator has been received, the method returns to block 312. If a new mode indicator has been received, the flow of the method returns to decision block 304.

Figure 4:
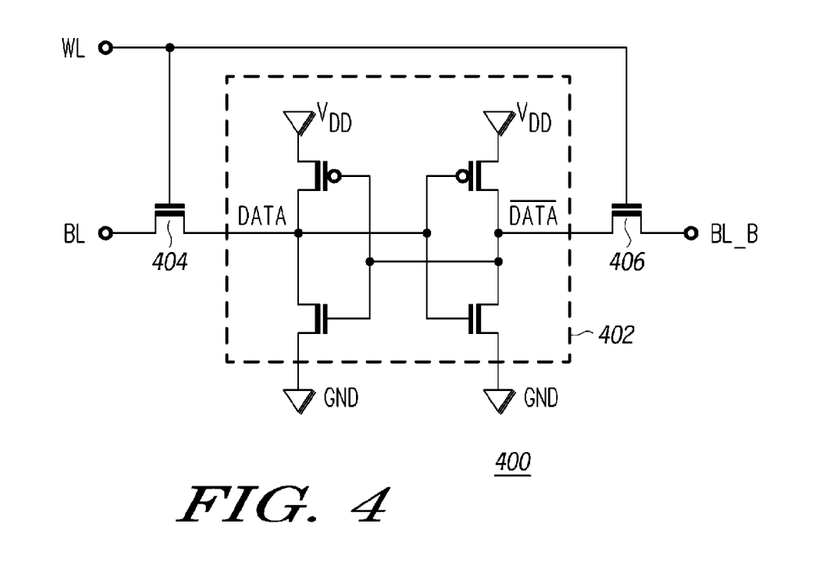
FIG. 4 is a block diagram of a particular embodiment of a high-density memory topology used in conjunction with the memory device of claim 1.

Referring to FIG. 4, a block diagram of a memory device 400 corresponding to a high-density memory, such as the first memory 108 of FIG. 1, is illustrated. The memory device 400 employs a topology that includes a bit cell 402 connected to complementary bitlines (BL and BL_B) through pass gate 404 and pass gate 406, respectively. The pass gate 402 and the pass gate 404 are controlled by a wordline (WL). Data may be written to the bit cell 402 via the wordline WL and the bitlines BL and BL_B during a write operation. Further the same wordline and bitlines can be used to read data stored in the bit cell 402 during a read operation. The pass gate 402 and the pass gate 404 are single transistor pass gates.

A method of operating memory devices has been disclosed. In a particular embodiment, the method includes in a first mode of operation providing a first voltage to a first memory having a first minimum operating voltage and a second memory having a second minimum operating voltage, the second minimum operating voltage being different from the first minimum operating voltage, wherein the first memory and the second memory are located within an integrated circuit. The method further includes accessing the first memory and accessing the second memory in the first mode of operation. The method also includes in a second mode of operation providing a second voltage to the first memory and the second memory, wherein the second voltage is less than the first minimum operating voltage, and accessing the second memory.

In a particular aspect, the method includes receiving a low-voltage mode of operation indication and changing a mode of operation for the integrated circuit to the second mode of operation from the first mode of operation in response to the low-voltage mode of operation indication. In another particular aspect, the method includes receiving an active mode of operation indication and changing a mode of operation for the integrated circuit to the first mode of operation from the second mode of operation in response to the active mode of operation indication.

In a particular aspect, the first memory has a first memory cell topology and the second memory has a second memory cell topology different from the first memory cell topology, and the second memory cell topology comprises a full pass gate controllable by a write control line. In another particular aspect, the first memory cell topology comprises a single transistor pass gate.

In a particular aspect, the method includes retrieving status data associated with data stored in the first memory from the second memory when the integrated circuit is in the second mode of operation.

In a particular embodiment, the method includes accessing a first memory located within an integrated circuit using a first access voltage and accessing a second memory located within the integrated circuit using a second access voltage less than the first access voltage, wherein the first memory is substantially inaccessible to write operations at the second access voltage. In a particular aspect, the first memory is substantially inaccessible to read operations at the second access voltage.

In another particular aspect, the method includes providing the second access voltage to the first memory and retaining data in the first memory when the second access voltage is provided to the first memory. In still another particular aspect, the method includes receiving an access request for the first memory when the second access voltage is provided to the first memory and providing the first access voltage to the first memory responsive to receiving the access request. In a particular aspect, the method includes receiving a low-voltage mode of operation indication and providing the second access voltage to the first memory and the second memory responsive to receiving the low-voltage mode of operation indication.

A device has been disclosed. In a particular embodiment, the device includes a first memory located within an integrated circuit, the first memory having a first memory cell topology with a first minimum operating voltage, and a second memory located within the integrated circuit, the second memory having a second memory cell topology with a second minimum operating voltage, wherein the second minimum operating voltage is less than the first minimum operating voltage. In a particular aspect, the device includes a processing core located at the integrated circuit, wherein the processing core is operable to access the first memory and the second memory when in a first mode of operation. In another particular aspect, the first mode of operation comprises an active mode of operation of the integrated circuit.

In a particular aspect the first memory is coupled to a first power supply terminal and the second memory is coupled to a second power supply terminal different from the first power supply terminal. In another particular aspect, first memory and the second memory are each coupled to a common power supply terminal. In another particular aspect, the first memory cell topology comprises a first static random access memory (SRAM) cell topology and the second memory cell topology comprises a second SRAM cell topology, wherein the first SRAM cell topology comprises fewer transistors than the second SRAM cell topology.

In a particular aspect, the second memory cell topology comprises a full pass gate controllable by a write control line. In another particular aspect, the first memory stores a set of data and the second memory stores a subset of the set of data. In still another particular aspect, the first memory is operable at a first minimum write voltage and the second memory is operable at a second minimum write voltage, the second minimum write voltage less than the first minimum write voltage.

The disclosure has been described with reference to specific embodiments. However, it will be appreciated that various modifications and changes can be made without departing from the scope of the present disclosure as set forth in the claims below. For example, a high-density memory has been described as part of the present disclosure. However, the techniques and devices described are readily extendable to high-speed memories that use a relatively high operating voltage. In addition, for example, the high-density memory has been described as being inaccessible to both read and write operations in the low-voltage mode of operation. However, the techniques and devices described herein are readily extendable to a high-density memory that operates in a read only mode when the integrated circuit is in a low-voltage mode of operation, so that the high-density memory is inaccessible to write operations, but remains accessible to read operations. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method, comprising:
  in a first mode of operation:
    providing a first voltage to a first memory having a first minimum operating voltage and to a second memory having a second minimum operating voltage, the second minimum operating voltage being different from the first minimum operating voltage, wherein the first memory and the second memory are located within an integrated circuit;
    accessing the first memory;
    accessing the second memory; and
  in a second mode of operation:
    providing a second voltage to the first memory and to the second memory,
    wherein the second voltage is less than the first minimum operating voltage;
  accessing the second memory to retrieve status data associated with data stored in the first memory from the second memory; and
  in response to determining the status data indicates data corresponding to data stored in the first memory has been changed, providing the first voltage to the first memory.

2. The method of claim 1, further comprising:
  receiving a low-voltage mode of operation indication; and
  changing a mode of operation for the integrated circuit to the second mode of operation from the first mode of operation in response to the low-voltage mode of operation indication.

3. The method of claim 1, further comprising:
  receiving an active mode of operation indication; and
  changing a mode of operation for the integrated circuit to the first mode of operation from the second mode of operation in response to the active mode of operation indication.

4. The method of claim 1, wherein the first memory has a first memory cell topology and the second memory has a second memory cell topology different from the first memory cell topology, and wherein the second memory cell topology comprises a full pass gate controllable by a write control line.

5. The method of claim 4, wherein the first memory cell topology comprises a single transistor pass gate.

6. A method, comprising:
  in a first mode of operation, accessing a first memory located within an integrated circuit using a first access voltage, the first memory having a first memory topology comprising a first arrangement of transistors;
  in a second mode of operation, accessing status data at a second memory located within the integrated circuit using a second access voltage less than the first access voltage, the second memory having a second memory topology comprising a second arrangement of transistors, wherein the first memory is substantially inaccessible to write operations at the second access voltage and wherein the second arrangement of transistors is different than the first arrangement of transistors, the status data indicative of a status of data stored at the first memory; and
  providing the first access voltage to the first memory in response to determining the status data indicates data corresponding to the data stored at the first memory has changed.

7. The method of claim 6, wherein the first memory is substantially inaccessible to read operations at the second access voltage.

8. The method of claim 6, further comprising:
  providing the second access voltage to the first memory; and
  retaining data in the first memory when the second access voltage is provided to the first memory.

9. The method of claim 8, further comprising:
  receiving an access request for the first memory when the second access voltage is provided to the first memory; and
  providing the first access voltage to the first memory responsive to receiving the access request.

10. The method of claim 6, further comprising:
  receiving a low-voltage mode of operation indication; and
  providing the second access voltage to the first memory and the second memory responsive to receiving the low-voltage mode of operation indication.

11. A device, comprising:
  a first memory located within an integrated circuit, the first memory having a first memory cell topology with a first minimum operating voltage, the first memory cell topology comprising a first arrangement of transistors;
  a second memory located within the integrated circuit, the second memory having a second memory cell topology with a second minimum operating voltage, wherein the second minimum operating voltage is less than the first minimum operating voltage and wherein the second memory cell topology comprises a second arrangement of transistors, the second arrangement of transistors different from the first arrangement of transistors, the second memory configured to store status information indicative of a status of data stored at the first memory; and
  a processing core located at the integrated circuit, the processing core operable to:
    access the first memory and the second memory when in a first mode of operation, and to access the second memory but not the first memory when in a second mode of operation;
    access the status information in the second mode of operation; and
    enter the first mode of operation in response to the status information indicating data corresponding to the data stored at the first memory has changed.

12. The device of claim 11, wherein the first mode of operation comprises an active mode of operation of the integrated circuit.

13. The device of claim 11, wherein the first memory is coupled to a first power supply terminal and the second memory is coupled to a second power supply terminal different from the first power supply terminal.

14. The device of claim 11, wherein the first memory and the second memory are each coupled to a common power supply terminal.

15. The device of claim 11, wherein the first memory cell topology comprises a first static random access memory (SRAM) cell topology and the second memory cell topology comprises a second SRAM cell topology, wherein the first SRAM cell topology comprises fewer transistors than the second SRAM cell topology.

16. The device of claim 11, wherein the second memory cell topology comprises a full pass gate controllable by a write control line.

17. The device of claim 11, wherein the first memory stores a set of data and the second memory stores a subset of the set of data.

18. The device of claim 11, wherein the first memory is operable at a first minimum write voltage and the second memory is operable at a second minimum write voltage, the second minimum write voltage less than the first minimum write voltage.

\* \* \* \* \*